United States Patent
Bickford et al.

(10) Patent No.: US 9,269,407 B1
(45) Date of Patent: Feb. 23, 2016

(54) SYSTEM AND METHOD FOR MANAGING CIRCUIT PERFORMANCE AND POWER CONSUMPTION BY SELECTIVELY ADJUSTING SUPPLY VOLTAGE OVER TIME

(71) Applicant: International Business Machines Corporation, Armonk, NY (US)

(72) Inventors: Jeanne P. Bickford, Essex Junction, VT (US); Eric A. Foreman, Fairfax, VT (US); Mark W. Kuemerle, Essex Junction, VT (US); Susan K. Lichtensteiger, Essex Junction, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/614,470

(22) Filed: Feb. 5, 2015

(51) Int. Cl.
*G11C 5/14* (2006.01)

(52) U.S. Cl.
CPC .................................. *G11C 5/147* (2013.01)

(58) Field of Classification Search
CPC .... G11C 5/146; G11C 11/417; G11C 11/419; G11C 29/02; G11C 5/14; G11C 5/147
USPC ............... 365/226, 227, 185.18, 185.23, 156, 365/189.11, 185.03
See application file for complete search history.

(56) References Cited

U.S. PATENT DOCUMENTS

| | | |
|---|---|---|
| 8,195,872 B2 | 6/2012 | Ito |
| 8,600,685 B2 | 12/2013 | Kalgren et al. |
| 8,661,274 B2 | 2/2014 | Hansquine et al. |
| 8,713,490 B1 | 4/2014 | Allen-Ware et al. |
| 8,781,792 B2 | 7/2014 | Visweswariah et al. |
| 2004/0267482 A1* | 12/2004 | Robertson ........ G01R 31/31727 702/118 |
| 2014/0097856 A1 | 4/2014 | Chen et al. |
| 2014/0176116 A1 | 6/2014 | Kumar et al. |
| 2014/0197895 A1 | 7/2014 | Chen et al. |
| 2015/0033081 A1 | 1/2015 | Bickford et al. |

FOREIGN PATENT DOCUMENTS

EP    2 509 204 A2    10/2012

OTHER PUBLICATIONS

Lichtensteiger et al., "Using Selective Voltage Binning to Maximize Yield", IEEE, ASMC 2012, pp. 7-10.
Schischke et al., "Life Cycle Inventory Analysis and Identification of Environmentally Significant Aspects in Semiconductor Manufacturing", IEEE, 2001, pp. 145-150.

* cited by examiner

*Primary Examiner* — Thong Q Le
(74) *Attorney, Agent, or Firm* — Gibbs & Riley, LLC; David A. Cain, Esq.

(57) ABSTRACT

Disclosed is a system that periodically increases the supply voltage applied to a power rail of an integrated circuit chip that is incorporated into a product, thereby compensating for age-dependent changes in a performance parameter sensitivity (e.g., in a delay sensitivity). In this system, the chip comprises at least a memory, an age monitor, a voltage selector and a power rail. The memory stores an age/voltage table. The age monitor automatically measures the age of the chip. Based on the age and using the age/voltage table, the voltage selector selects a specific supply voltage and outputs a voltage selection signal to an adjustable voltage regulator, which can apply (e.g., automatically or on-demand) that specific supply voltage to the power rail. Also disclosed is a method for regulating the power supplied to an integrated circuit chip, which is incorporated into a product, and a method for generating an age/voltage table.

20 Claims, 7 Drawing Sheets

| POHs | Voltage |
|---|---|
| 0 | 0.79 |
| 500 | 0.80 |
| 1000 | 0.82 |
| 2000 | 0.88 |

FIG. 2

$$D_{actual} = D_{nonminal} + (x\sigma D_{sensitivity})$$

| POHs | $x\sigma\, D_{sensitivity}$ |
|------|-----------------------------|
| 0    | $0\sigma$                   |
| 500  | $1.0\sigma$                 |
| 1000 | $2.5\sigma$                 |
| 2000 | $3.0\sigma$                 |

600

$$D_{actual} = D_{nonminal} + (x\sigma D_{sensitivity})$$

| Voltage | $x\sigma D_{sensitivity}$ |
|---|---|
| 0.7 | -3.0σ |
| . . . | |
| 0.79 | -1.2σ |
| . . . | |
| 0.80 | -1.0σ |
| . . . | |
| 0.82 | -0.6σ |
| . . . | |
| 0.88 | 0.6σ |
| . . . | |
| 1.0 | 3.0σ |

SYSTEM AND METHOD FOR MANAGING CIRCUIT PERFORMANCE AND POWER CONSUMPTION BY SELECTIVELY ADJUSTING SUPPLY VOLTAGE OVER TIME

BACKGROUND

The present disclosure relates to the effects of aging on the performance of integrated circuits and, more particularly, to a system and method for managing circuit performance and power consumption to compensate for the effects of aging by selectively adjusting supply voltage over time.

More particularly, during the design of an integrated circuit, a voltage-frequency curve is generated to describe the minimum supply voltage required to operate the integrated circuit at a specific frequency. Typically, this voltage-frequency curve includes a voltage margin to account for the effects of aging. That is, various failure mechanisms including, but are not limited to, time-dependent dielectric breakdown (TDDB), hot carrier injection (HCI), negative bias temperature instability (NBTI), positive bias temperature instability (PBTI), and electromigration (EM), cause the components (e.g., devices, interconnects, etc.) of an integrated circuit to degrade over time, thereby reducing their speed. Thus, a voltage-frequency curve that is associated with the beginning of life (BOL) of the integrated circuit will be different than a voltage-frequency curve that is associated with the end of life (EOL) of the same integrated circuit and, specifically, the minimum supply voltage required to operate the integrated circuit at a specific frequency will be lower at the beginning of life (BOL) of the integrated circuit as compared to at the end of life (EOL) of that same integrated circuit. Consequently, a "voltage margin" is typically used to ensure that, when the integrated circuit is incorporated into a system, it will operate at or above the specific frequency without fail throughout its expected lifetime. However, due to this voltage margin, the components of the integrated circuit will operate faster than necessary within the system at the beginning of life (BOL) and will, thereby consume more power than is necessary.

SUMMARY

Disclosed herein is a system for regulating the power supplied to an integrated circuit chip that is incorporated into a product and, particularly, for periodically increasing the supply voltage applied to a power rail of such an integrated circuit chip in order to compensate for age-dependent changes in a performance parameter and, particularly, in a performance parameter sensitivity (e.g., in delay sensitivity). The system can comprise an adjustable voltage regulator and an integrated circuit chip, which are both incorporated into a product. The integrated circuit chip can comprise at least a power rail for a positive supply voltage, a power supply pin electrically connecting the power rail and the adjustable voltage regulator, a memory, an age monitor and a voltage selector in communication with the memory, the age monitor and the adjustable voltage regulator. The memory can store an age/voltage table that associates different ages of the integrated circuit chip with different positive supply voltages for the power rail such that, as the integrated circuit chip ages, the positive supply voltage increases. The age monitor can automatically measure the age of the integrated circuit chip. The voltage selector can access the age/voltage table, can use the age/voltage table to automatically make a selection of specific, age-optimized, positive supply voltage for the power rail based on the measured age of the integrated circuit chip and can output that selection, as a voltage selection signal, to the adjustable voltage regulator. The adjustable voltage regulator can then apply (e.g., automatically or on-demand) the specific, age-optimized, positive supply voltage to the power rail in response to the voltage selection signal.

Also disclosed herein is an associated method for regulating the power supplied to an integrated circuit chip that is incorporated into a product and, particularly, for periodically increasing the supply voltage applied to a power rail of the integrated circuit chip in order to compensate for age-dependent changes in a performance parameter (e.g., delay) and, particularly, in a performance parameter sensitivity (e.g., in delay sensitivity). The method can comprise providing a product comprising an adjustable voltage regulator and an integrated circuit chip. The method can further comprise automatically measuring the age of the integrated circuit chip. The process of measuring the age of the integrated circuit chip can be performed by an age monitor onboard the integrated circuit chip. The method can further comprising accessing an age/voltage table, which is stored in a memory onboard the integrated circuit chip and which associates different ages of the integrated circuit chip with different positive supply voltages for the power rail such that, as the integrated circuit chip ages, the positive supply voltage increases. Next, this age/voltage table can be used to make a selection of a specific, age-optimized, positive supply voltage for the power rail based on the measured age. Once the selection is made, the selection can be output, as a voltage selection signal, to an adjustable voltage regulator, which is also incorporated into the product and which can apply (e.g., automatically or on-demand) the specific, age-optimized, positive power supply to the power rail in response to the voltage selection signal. The processes of accessing the age/voltage table, using the age/voltage table to make a selection of a specific, age-optimized, positive supply voltage and outputting the selection, as a voltage selection signal, to the adjustable voltage regulator can each be performed by a voltage selector onboard the integrated circuit chip.

Also disclosed herein is a method for generating the age/voltage table, which is used in the above-described system and method to regulate the power supplied to an integrated circuit chip and, particularly, to periodically increase the supply voltage applied to a power rail of the integrated circuit chip in order to compensate for age-dependent changes in a performance parameter (e.g., delay) and, particularly, in a performance parameter sensitivity (e.g., delay sensitivity). This method can comprise performing a timing analysis (e.g., a statistical static timing analysis (SSTA)) of the integrated circuit chip. Specifically, this timing analysis can be performed, assuming a first age of the integrated circuit chip (e.g., an initial age at the beginning of life (BOL) of the integrated circuit chip) and using a first positive supply voltage in order to determine a first value for a performance parameter (e.g., a first value for delay) of the integrated circuit chip. The first age and first positive supply voltage can be used as the initial values in an initial row of the age/voltage table. Then, a second age that is greater than the first age of the integrated circuit chip can be selected. Once the second age is selected, a second value for the performance parameter (e.g., a second value for delay) can be determined assuming the second age. Specifically, this second value can be determined using the first positive supply voltage and further based on the first value of the performance parameter and on a pre-characterized age-to-performance parameter sensitivity relationship. Next, the method can comprise determining whether, given the second value for the performance parameter, the integrated circuit chip fails to meet a timing target (e.g., a slack target) for the integrated circuit chip and, if so, further determining what second positive supply voltage, which is greater than the first positive supply voltage, should be used to adjust the performance parameter such that the integrated circuit chip meets that timing target. The second age and second positive supply voltage can be the next values in the next row of the age/voltage table. These same processes can, optionally, be repeated to acquire additional positive supply voltages for additional ages (e.g., a third age, a fourth age, etc.) to add additional rows to the age/voltage table until such time as the target age for the integrated circuit chip within the product is reached.

Also disclosed herein is a computer program product. This computer program product can comprise a computer readable storage medium having program instructions embodied therewith. The program instructions can be executable by a computer to cause the computer to perform the above-described method for generating the age/voltage table for generating the age/voltage table, which is used in the above-described system and method.

BRIEF DESCRIPTION OF THE DRAWINGS

The embodiments herein will be better understood from the following detailed description with reference to the drawings, which are not necessarily drawn to scale and in which:

FIG. 2 illustrates an exemplary age/voltage table;

DETAILED DESCRIPTION

Figure 1:
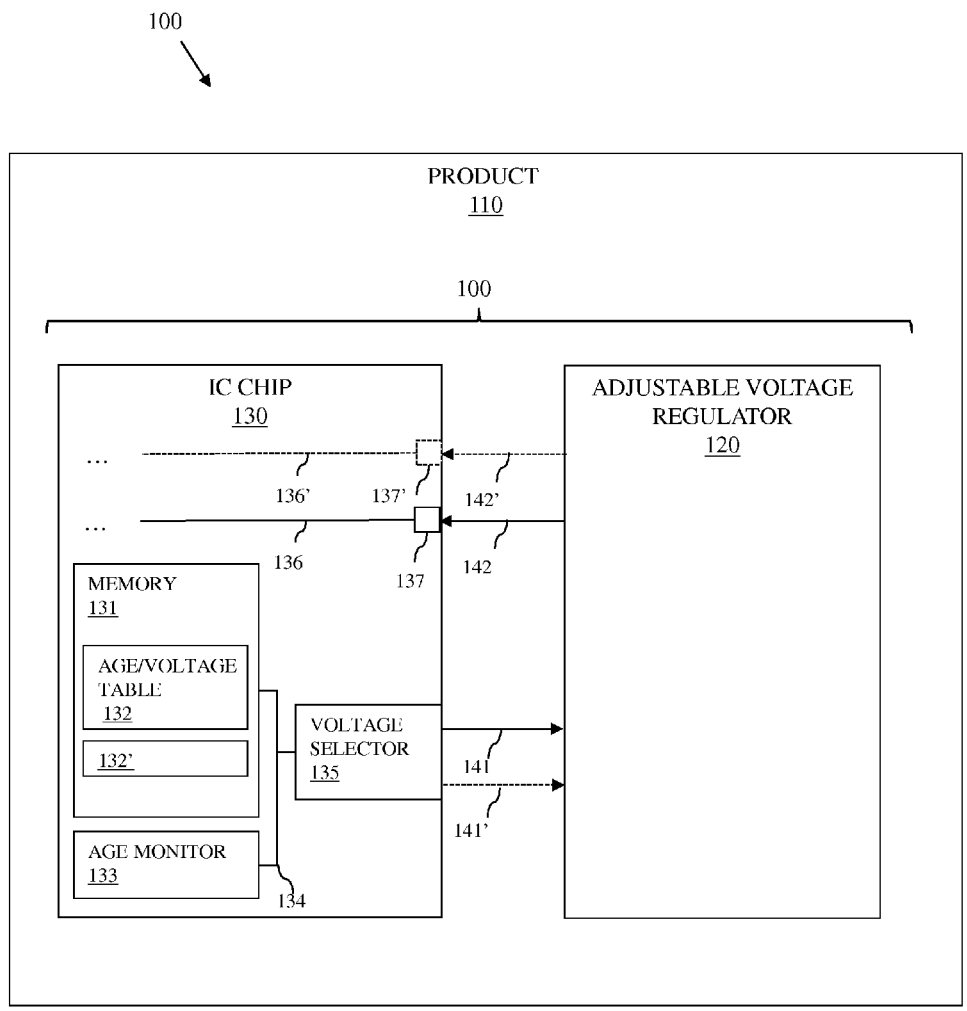
FIG. 1 is a schematic diagram illustrating a system for regulating power supplied to an integrated circuit chip, which is incorporated into a product.

As mentioned above, during the design of an integrated circuit, a voltage-frequency curve is generated to describe the minimum supply voltage required to operate the integrated circuit at a specific frequency. Typically, this voltage-frequency curve includes a voltage margin to account for the effects of aging. That is, various failure mechanisms including, but are not limited to, time-dependent dielectric breakdown (TDDB), hot carrier injection (HCI), negative bias temperature instability (NBTI), positive bias temperature instability (PBTI), and electromigration (EM), cause the components (e.g., devices, interconnects, etc.) of an integrated circuit to degrade over time, thereby reducing their speed. Thus, a voltage-frequency curve that is associated with the beginning of life (BOL) of the integrated circuit will be different than a voltage-frequency curve that is associated with the end of life (EOL) of the same integrated circuit and, specifically, the minimum supply voltage required to operate the integrated circuit at a specific frequency will be lower at the beginning of life (BOL) of the integrated circuit as compared to at the end of life (EOL) of that same integrated circuit. Consequently, a "voltage margin" is typically used to ensure that, when the integrated circuit is incorporated into a system, it will operate at or above the specific frequency without fail throughout its expected lifetime. However, due to this voltage margin, the components of the integrated circuit will operate faster than necessary within the system at the beginning of life (BOL) and will, thereby consume more power than is necessary.

In view of the foregoing, disclosed herein is a system for regulating the power supplied to an integrated circuit chip that is incorporated into a product and, particularly, for periodically increasing the positive supply voltage applied to a power rail of the integrated circuit chip in order to compensate for age-dependent changes in a performance parameter (e.g., delay) and, particularly, in a performance parameter sensitivity (e.g., a delay sensitivity), which is a measure of product reliability. Specifically, the system can comprise an integrated circuit chip and an adjustable voltage regulator, which are incorporated into a product. The integrated circuit chip can comprise a memory, an age monitor, a voltage selector and a power rail for a positive supply voltage. The memory can store an age/voltage table. The age monitor can automatically measure the age of the chip. Based on the measured age and using the age/voltage table, the voltage selector can select a specific, age-optimized, positive supply voltage and can output that selection, as a voltage selection signal, to the adjustable voltage regulator. The adjustable voltage regulator can subsequently apply (e.g., automatically or on-demand) that specific, age-optimized, positive supply voltage to the power rail, ensuring that product-level power and performance requirements are met until the expected end of life (EOL) of the integrated circuit chip without requiring the use of a voltage margin. Also disclosed are an associated method for regulating the power supplied to an integrated circuit chip and a method for generating the age/voltage table used to regulate the power supplied to an integrated circuit chip.

More particularly, referring to FIG. 1, disclosed herein is a system 100 that comprises an integrated circuit chip 130 and an adjustable voltage regulator 120 (also referred to herein as a variable voltage regulator), both of which are incorporated into the same product 110. The system 100 is designed to regulate the power supplied by the adjustable voltage regulator 120 to a power rail 136 of the integrated circuit chip 130 and, specifically, to periodically increase the positive supply voltage applied by the adjustable voltage regulator 120 to the power rail 136 (e.g., when threshold ages are achieved) in order to compensate for age-dependent changes in a performance parameter (e.g., delay) and, particularly, in a performance parameter sensitivity (e.g., a delay sensitivity), which is a measure of product reliability.

The product 110 can be either (a) an intermediate product, such as a motherboard or other printed circuit board, or (b) an end product (e.g., any product that includes integrated circuit chips, ranging from toys and other low-end applications to advanced computer products having a display, a keyboard or other input device, and a central processor).

The integrated circuit chip 130 can be in the form of a bare die or in a packaged form. It should be understood that in the latter case, the integrated circuit chip 130 can be mounted in a single chip package (such as a plastic carrier) or in a multichip package (such as a ceramic carrier that has either or both surface interconnections or buried interconnections). In any case, the integrated circuit chip 130 can be integrated with other integrated circuit chips, including the adjustable voltage regulator 120, discrete circuit elements, and/or other signal processing devices as part of the product 110.

The integrated circuit chip 130 can comprise at least a power rail 136 for a positive supply voltage, a power supply pin 137 that electrically connects the adjustable voltage regulator 120 to the power rail 136, a memory 131, an age monitor 133 and a voltage selector 135 (i.e., voltage selection logic), which is in communication with and, particularly, electrically connected to the memory 131 and the age monitor 133 (e.g., through on-chip interconnects 134) and to the adjustable voltage regulator 120 (e.g., through a signal bus 141). It should be understood that the integrated circuit chip 130 will comprise various additional components (not shown) including, but not limited to, a power rail for a negative supply voltage or ground as well as additional memory block(s), functional block(s), etc., depending upon the purpose of the integrated circuit chip 130 within the product 110. The integrated circuit chip 130 can, optionally, further comprise a second power rail 136' for a second positive supply voltage and a corresponding second power supply bin 137' (e.g., when one or more of the memory and/or functional blocks on the integrated circuit chip 130 require multiple different positive supply voltages).

In any case, the age monitor 133 can automatically measure (i.e., can be adapted to automatically measure, configured to automatically measure, etc.) the age of the integrated circuit chip 130 and can communicate that measured age to the voltage selector 135 (e.g., over an interconnect 134). Age can, for example, be measured as power-on-hours (POHs). That is, the age monitor 133 can comprise a POHs monitor (also referred to herein as a POHs timer) that measures the time, in hours, that electrical power is applied to the integrated circuit chip 130 within the product 110 and, thereby the age of the integrated circuit chip 130. Various different POHs monitors are well known in the art (e.g., see U.S. patent application Ser. No. 13/948,811 of Bickford et al. filed on Jul. 23, 2013 and incorporated herein by reference) and, thus, the details of such POHs monitors are omitted from this specification in order to allow the reader to focus on the salient aspects of this invention. Alternatively, age can be measured in terms of performance degradation. That is, the age monitor 133 can comprise a performance monitor that measures the change in value (i.e., the delta) of a measurable performance parameter that is known to degrade as the integrated circuit chip ages. For example, the performance monitor can measure changes in the frequency of an oscillating circuit that is powered whenever electrical power is applied to the integrated circuit chip 130 because the frequency of such an oscillating circuit is known to degrade (i.e., decrease) with age (See U.S. Patent Application Publication No. 20140176116 of Kumar et al., published on Jun. 26, 2014 and incorporated herein by reference). For purposes of illustration, additional details of the system 100 are described below with reference to an age monitor that measures POHs.

The memory 131 can store an age/voltage table 132 that associates multiple different ages (e.g., numbers of POHs) of the integrated circuit chip 130 with different age-optimized positive supply voltages (e.g., different VDDs) for the power rail 136 such that with each incremental change in age (e.g., with each incremental change in the number of POHs or with each incremental change in the performance parameter delta), the age-optimized positive supply voltage also increases. Such an age/voltage table 132 can be used, by the system 100 as described in greater detail below, such that product-level power and performance requirements are met until the expected end of life (EOL) of the integrated circuit chip 130 without requiring the use of a voltage margin and, thereby without overly exceeding the product-level performance requirements and consuming more power than is necessary at the beginning of life (BOL) of the integrated circuit chip 130.

Figure 2:
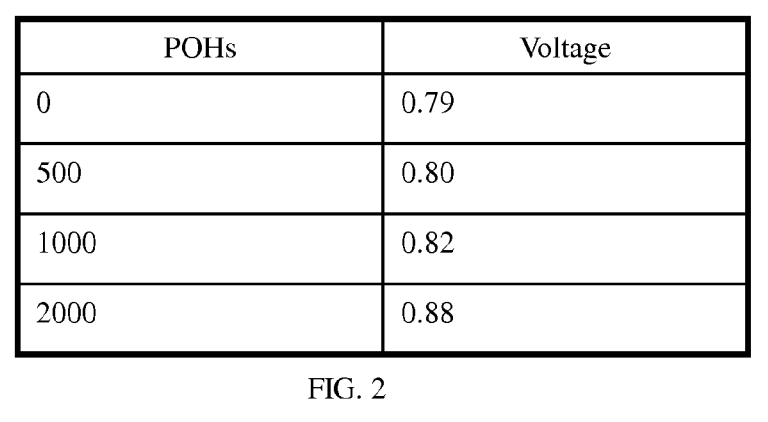

Specifically, FIG. 2 shows an exemplary age/voltage table 132 and, particularly, a POHs/voltage table. In this POHs/voltage table, the age-optimized positive supply voltage to be used from approximately zero POHs at the beginning of life (BOL) of the integrated circuit chip 130 to 499 POHs is 0.79V, the age-optimized positive supply voltage to be used from 500 POHs to 999 POHs is 0.80V, the age-optimized positive supply voltage to be used from 1000 POHs (i.e., at the beginning of life (BOL) of the integrated circuit chip 130) to 1999 POHs is 0.82V, and the age-optimized positive supply voltage to be used at 2000 POHs to the end of life (EOL) of the integrated circuit chip 130 (i.e., to a target age and, particularly, a target number of POHs for the integrated circuit chip 130 within the product 110) is 0.88V. Thus, the POHs/voltage table provides for three changes in the positive supply voltage triggered by achieving three corresponding threshold ages (i.e., 500 POHs, 1000 POHs, and 2000 POHs) over the course of the expected useful life of the integrated circuit chip 130 within the product 110. It should, however, be understood that the POHs/voltage table is provided for illustration purposes and is not intended to be limiting. The age/voltage table 132 stored in the memory 131 could provide for any number of one or more changes in the positive supply voltage over the course of the expected useful life of the integrated circuit chip 130 within the product 110. Furthermore, the change(s) may be made at uniform increments in age (e.g., at every x number of POHs (not shown)) or at non-uniform increments in age (e.g., as illustrated in FIG. 2). It should be noted that an exemplary method for generating such an age/voltage table 132 and storing it in the memory 131 is described in greater detail below and illustrated in the flow diagram of FIG. 4.

In any case, the voltage selector 135 can access the age/voltage table 132 from the memory 131 (e.g., over an interconnect 134) and can use that age/voltage table 132 (i.e., can be adapted to use that age/voltage table 132, can be configured to use that age/voltage table 132, etc.) to automatically make a selection of a specific, age-optimized, positive supply voltage for the power rail 136 based on the age of the integrated circuit chip 130 as measured by the age monitor 133. The voltage selector 135 can further output that selection (i.e., can be adapted to output that selection, can be configured to output that selection, etc.), as a voltage selection signal, to the adjustable voltage regulator 120 (e.g., over the signal bus 141).

The adjustable voltage regulator 120 can comprise an additional integrated circuit chip, which, as mentioned above, is also incorporated into the product 110 (e.g., on the same motherboard or printed circuit board). This adjustable voltage regulator 120 can apply (i.e., can be adapted to apply, can be configured to apply, etc.) any one of multiple different positive supply voltages to the power supply pin 137 and, thereby to the power rail 136 based on the voltage selection signal received from the voltage selector 135.

Specifically, the adjustable voltage regulator 120 can switch the applied positive supply voltage automatically in response to the received voltage selection signal. That is, receipt, by the adjustable voltage regulator 120, of a voltage selection signal indicating a selection of the specific, age-optimized, positive supply voltage, which is different from the positive supply voltage currently being applied to the power supply pin 137, can trigger the adjustable voltage regulator 120 to switch the positive supply voltage (i.e., to automatically apply the specific, age-optimized, positive supply voltage to the power supply pin 137 and, thereby to the power rail 136). Thus, depending upon the voltage selection signal received from the voltage selector 135, the adjustable voltage regulator 120 can periodically and automatically change the positive supply voltage applied to the power rail 136 and, particularly, can periodically and automatically increase the positive supply voltage applied to the power rail 136 to a different age-optimized, positive supply voltage whenever a corresponding threshold age (as dictated by the age/voltage table 132) is achieved. Alternatively, this process can be initiated manually (e.g., on-demand of a user). In this case, receipt of both a voltage selection signal indicating a selection of the specific, age-optimized, positive supply voltage, which is different from the positive supply voltage currently being applied, and a user command (e.g., issued through a user interface of the product) can be required to cause the adjustable voltage regulator 120 to switch the positive supply voltage.

In any case, by using periodically increasing positive supply voltage and, particularly, by using age-optimized, positive supply voltages to power the integrated circuit chip 130, the system 100 disclosed herein compensates for age-dependent changes in a performance parameter (e.g., delay) and, particularly, in a performance parameter sensitivity (e.g., a delay sensitivity) and ensures that product-level power and performance requirements are met until the expected end of life (EOL) of the integrated circuit chip 130 without requiring the use of a voltage margin and, thereby without overly exceeding the product-level performance requirements or consuming more power than is necessary at the beginning of life (BOL) of the integrated circuit chip 130.

It should be noted that the system 100 described above could optionally be used to regulate positive supply voltages on more than one power rail on the integrated circuit chip 130. For example, as mentioned above, the integrated circuit chip 130 can, optionally, further comprise a second power rail 136' for a second positive supply voltage and a corresponding second power supply bin 137' (e.g., when one or more of the memory and/or functional blocks on the integrated circuit chip 130 require multiple different positive supply voltages). In this case, the memory 131 can further store a second age/voltage table 132' for the second power rail 136'. The voltage selector 135 can access this second age/voltage table 132' and can use the second age/voltage table 137' to automatically make a second selection of a second specific, age-optimized, positive supply voltage for the second power rail 136' based on the age of the integrated circuit chip 130, as measured by the age monitor 133. The voltage selector 135 can then output the second selection, as a second voltage selection signal, to the adjustable voltage regulator 120 (e.g., over a second signal bus 141'). Following receipt of the second voltage selection signal, the adjustable voltage regulator 120 can subsequently apply (e.g., automatically or on-demand, as discussed above) the second specific, age-optimized, power supply voltage to the second power supply pin 137' and, thereby to the second power rail 136'.

Figure 3:
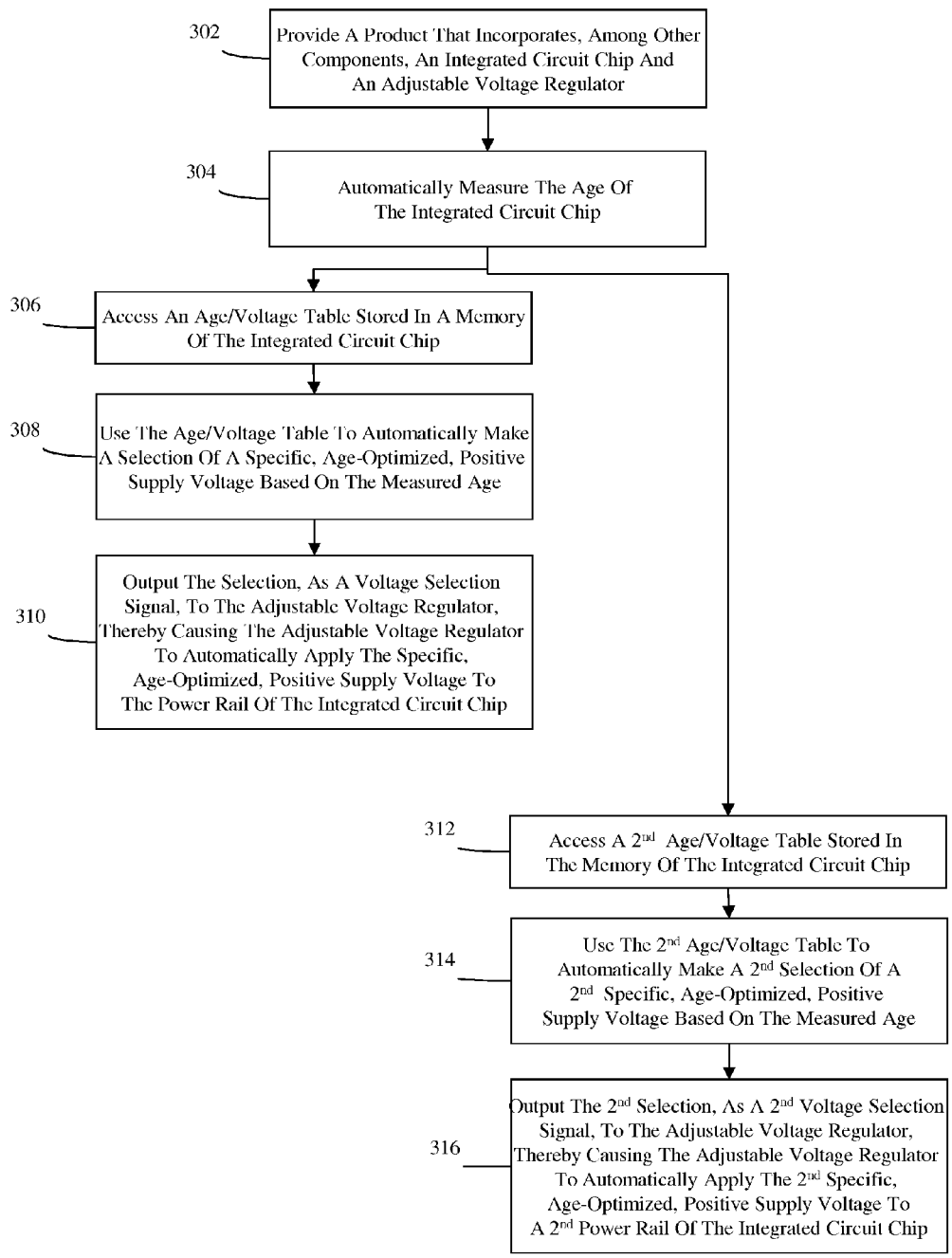
FIG. 3 is a flow diagram illustrating a method for regulating power supplied to an integrated circuit chip, which is incorporated into a product.

Referring to FIG. 3 in combination with FIG. 1, also disclosed herein an associated method for regulating, within a product 110, the power supplied by an adjustable voltage regulator 120 to the power rail 136 of an integrated circuit chip 130 and, specifically, to periodically increase the positive supply voltage applied by the adjustable voltage regulator 120 to the power rail 136 (e.g., when threshold ages are achieved) in order to compensate for age-dependent changes in a performance parameter (e.g., delay) and, particularly, in a performance parameter sensitivity (e.g., a delay sensitivity), which is a measure of product reliability.

More particularly, the method can comprise providing a product 110 that incorporates, among other components, an integrated circuit chip 130 and an adjustable voltage regulator 120, as discussed in greater detail above (302). The method can further comprise automatically measuring the age of the integrated circuit chip 130 (304). The process of automatically measuring the age of the integrated circuit chip 130 can, for example, be performed by an age monitor 133 onboard the integrated circuit chip 130. As discussed in greater detail above, the age monitor 133 can comprise a POHs monitor (also referred to herein as a POHs timer) that measures age in number of POHs (i.e., that measures the time, in hours, that electrical power is applied to the integrated circuit chip 130 within the product 110). Alternatively, the age monitor 133 can comprise a performance monitor that measures age as the change in value of a measurable performance parameter that is known to degrade as the integrated circuit chip ages. The method can further comprise accessing an age/voltage table 132 (e.g., as illustrated in FIG. 2 and described in detail above), which is stored in memory 131 and which associates multiple different ages of the integrated circuit chip 130 with different age-optimized positive supply voltages (e.g., different VDDs) for the power rail 136 such that with each incremental change in age (e.g., with each incremental change in the number of POHs or with each incremental change in the performance parameter delta), the age-optimized positive supply voltage also increases (306). This age/voltage table 132 can then be used to automatically make a selection of a specific, age-optimized, positive supply voltage for the power rail 136 based on the age of the integrated circuit chip 130 as measured by the age monitor 133 (308). The selection can then be output, as a voltage selection signal, to the adjustable voltage regulator 120 (e.g., over the signal bus 141) so that the adjustable voltage regulator 120 can subsequently apply the specific, age-optimized, positive supply voltage to the power supply pin 137 and, thereby to the power rail 136 (310).

As discussed in detail above with regard to the system, switching of the applied positive supply voltage can be performed automatically, by the adjustable voltage regulator 120, in response to the received voltage selection signal. That is, receipt, by the adjustable voltage regulator 120, of a voltage selection signal indicating a selection of the specific, age-optimized, positive supply voltage, which is different from the positive supply voltage currently being applied to the power supply pin 137, can trigger the adjustable voltage regulator 120 to switch the positive supply voltage (i.e., to automatically apply the specific, age-optimized, positive supply voltage to the power supply pin 137 and, thereby to the power rail 136). Alternatively, this process can be initiated manually (e.g., on-demand of a user). In this case, receipt of both a voltage selection signal indicating a selection of the specific, age-optimized, positive supply voltage, which is different from the positive supply voltage currently being applied, and a user command (e.g., initiated through a user interface of the product) can be required to cause the adjustable voltage regulator 120 to switch the positive supply voltage. In any case, the processes (306)-(310) of accessing the age/voltage table, using the age/voltage table to make a selection of a specific, age-optimized, positive supply voltage and outputting that selection, as a voltage selection signal, to the adjustable voltage regulator 120 can each be performed by a voltage selector 135 onboard the integrated circuit chip 130. By using periodically increasing positive supply voltages and, particularly, by using age-optimized, positive supply voltages to power the integrated circuit chip 130, the method disclosed herein compensates for age-dependent changes in a performance parameter (e.g., delay) and, particularly, in a performance parameter sensitivity (e.g., a delay sensitivity) and ensures that product-level power and performance requirements are met until the expected end of life (EOL) of the integrated circuit chip 130 without requiring the use of a voltage margin and, thereby without overly exceeding the product-level performance requirements or consuming more power than is necessary at the beginning of life (BOL) of the integrated circuit chip 130.

It should be noted that the method described above could optionally be used to regulate positive supply voltages on more than one power rail on the integrated circuit chip 130. For example, as mentioned above, the integrated circuit chip 130 can, optionally, further comprise a second power rail 136' for a second positive supply voltage and a corresponding second power supply pin 137' (e.g., when one or more of the memory and/or functional blocks on the integrated circuit chip 130 require multiple different positive supply voltages). In this case, method can further comprise accessing a second age/voltage table 132', which is for the second power rail 136' and which is stored in the memory 131 (312). This second age/voltage table 132' can then be used to automatically make a second selection of a second specific, age-optimized, positive supply voltage for the second power rail 136' based on the age of the integrated circuit chip 130, as measured by the age monitor 133 (314). The second selection can then be output, as a second voltage selection signal, to the adjustable voltage regulator 120 (e.g., over a second signal bus 141') and the adjustable voltage regulator 120 can subsequently apply (e.g., automatically or on-demand, as discussed above) the second specific, age-optimized, power supply voltage to the second power supply pin 137' and, thereby to the second power rail 136'(316).

Figure 4:
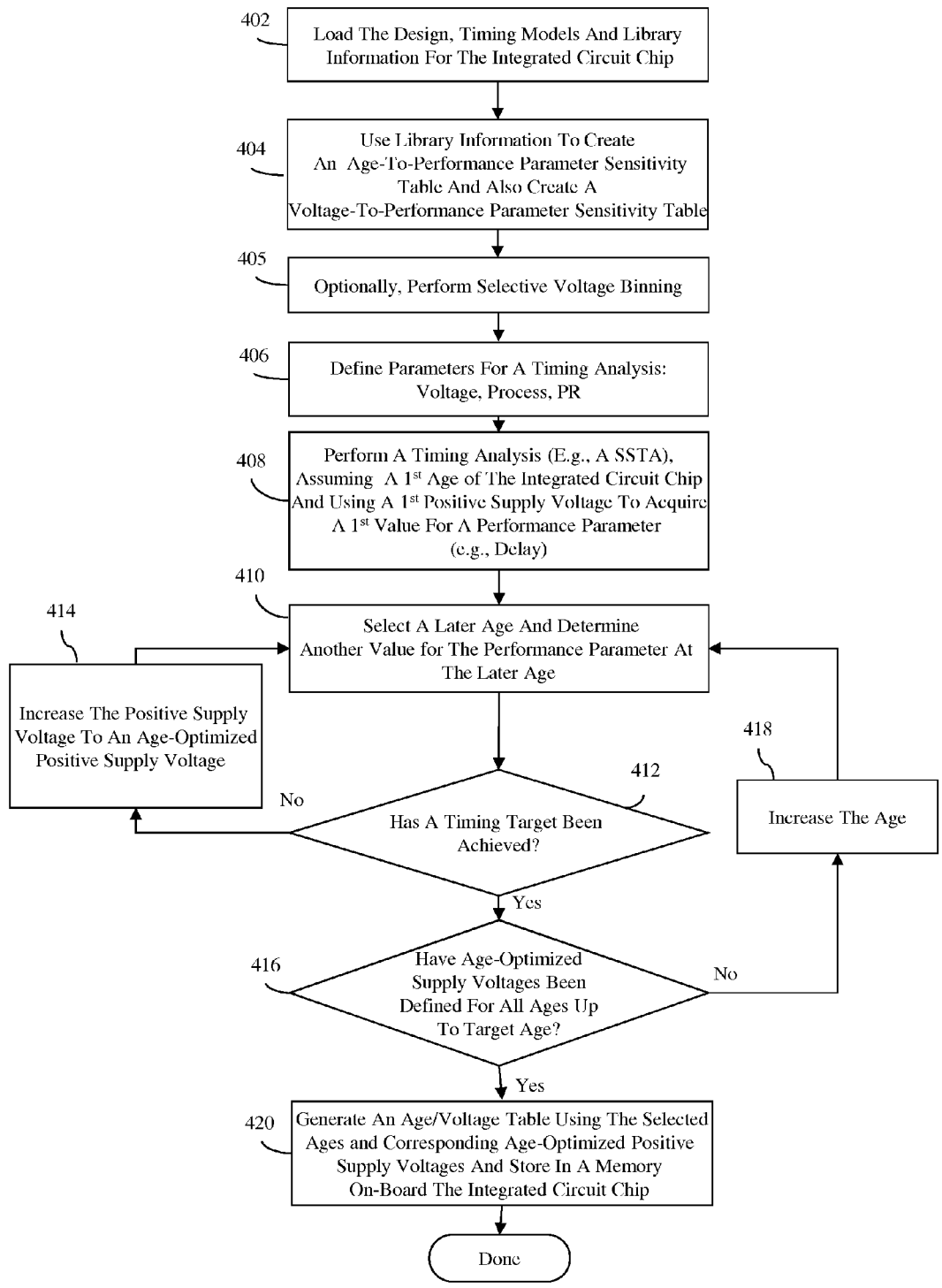
FIG. 4 is a flow diagram illustrating a method of forming an age/voltage for use in the above-referenced system and method.

Referring to FIG. 4 in combination with FIG. 1, also disclosed herein is a method for generating an age/voltage table (e.g., the age/voltage table 132), which is used in the above-described system 100 of FIG. 1 and the method of FIG. 3 for regulating, within a product 110, the power supplied by an adjustable voltage regulator 120 to the power rail 136 of an integrated circuit chip 130 and, specifically, to periodically increase the positive supply voltage applied by the adjustable voltage regulator 120 to the power rail 136 (e.g., when threshold ages are achieved) in order to compensate for age-dependent changes in a performance parameter (e.g., delay) and, particularly, in a performance parameter sensitivity (e.g., a delay sensitivity), which is a measure of product reliability.

The method can comprise loading, into a computer-aided design system, the design of the integrated circuit chip 130, the timing models for the integrated circuit chip 130 and library information for the integrated circuit chip 130 (402). The library information can include, amongst other library information, specific library information that pre-characterizes the relationship between a performance parameter (e.g., delay) and the age of the integrated circuit chip and, particularly, pre-characterizes the relationship between a performance parameter sensitivity (e.g., a delay sensitivity), which is also referred to herein as a product reliability (PR) parameter, and the age of the integrated circuit chip (e.g., as represented by number of power-on-hours (POHs) or, alternatively, by a performance parameter delta). The method can further comprise using this specific library information to create an age-to-performance parameter sensitivity table (e.g., a POHs-to-delay sensitivity table) and also creating a voltage-to-performance parameter sensitivity table (e.g., a voltage-to-delay sensitivity table) (404).

Figure 5:
FIG. 5 illustrates an exemplary age-to-performance parameter sensitivity table created at process 404 in the method of FIG. 4.

Specifically, process 404 can comprise using specific library information to create an age-to-performance parameter sensitivity table, which defines the relationship between the age of the integrated circuit chip and performance parameter sensitivity and, more specifically, which indicates various different numbers (x) of standard deviations (σ) (also referred herein as different numbers of units sigma) of the performance parameter sensitivity for different ages. For purposes of illustration, this performance parameter sensitivity can comprise delay sensitivity ($D_{sensitivity}$). Delay sensitivity ($D_{sensitivity}$) refers to units of time over a single standard deviation (e.g., picoseconds/σ) and can be used to compute delay ($D_{actual}$) of the integrated circuit chip as follows:

$$D_{actual} = D_{nominal}(x\sigma D_{sensitivity}),\qquad(1)$$

where $D_{nominal}$ is the nominal delay value (also referred to as the zero-σ delay value for the delay distribution), where $x\sigma D_{sensitivity}$ is a specific number (x) of standard deviations of the delay sensitivity and where $x\sigma D_{sensitivity}$ is dependent upon the age of the integrated circuit chip. The specific library information associated with the integrated circuit chip can indicate how increasing the age (i.e., increasing the number of power-on-hours (POHs)) will impact the number (x) of standard deviations of the delay sensitivity ($D_{sensitivity}$), as defined in equation (1). For example, the specific library information can indicate that the value of x will be significantly high (e.g., 3) at a maximum number of power-on-hours (POHs) (e.g., 2000 POHs). Thus, if $D_{sensitivity}$ is 10 picoseconds/σ and $D_{nominal}$ is 50 picoseconds, then, $D_{actual}$ will be 80 picoseconds. The specific library information can further indicate that the value of x will decrease (e.g., to 2.5) at a lesser number of power-on-hours (POHs) (e.g., 1000 POHs) so that, if $D_{sensitivity}$ is 10 picoseconds/σ and $D_{nominal}$ is 50 picoseconds, $D_{actual}$ will be drop to 75 picoseconds, and so on. This specific library information can, thus, be used to complete an age-to-performance parameter sensitivity table at process 404. FIG. 5 illustrates an exemplary age-to-performance parameter sensitivity table and, particularly, an exemplary POHs-to-delay sensitivity table, which indicates various different numbers (x) of standard deviations (σ) of delay sensitivity for different numbers of POHs, starting at the beginning of the life (BOL) with, for example, 0 POHs through to the end of life (EOL) (also referred to herein as the expected end of the useful life of the integrated circuit chip) with, for example, 2000 POHs.

Figure 6:
FIG. 6 illustrates an exemplary voltage-to-performance parameter sensitivity table created at process 404 in the method of FIG. 4; and, FIG. 7 depicts a representative hardware environment (i.e., a computer system) for implementing the method of FIG. 4.

Additionally, process 404 can comprise creating a voltage-to-performance parameter sensitivity table, which similarly defines various different numbers (x) of standard deviations (σ) of the same performance parameter sensitivity (e.g., delay sensitivity ($D_{sensitivity}$) in picoseconds/σ) for different positive supply voltages (e.g., as illustrated in the exemplary voltage-to-delay sensitivity table of FIG. 6). This voltage-to-performance parameter sensitivity table can be created assuming, for example, a given range of possible positive supply voltages (e.g., 0.7V to 1.0V) and further assuming that a high negative number of standard deviations (e.g., −3.0σ) of the performance parameter sensitivity corresponds to the lowest possible positive supply voltage (e.g., 0.7V) and a high positive number of standard deviations (e.g., 3.0σ) of the performance parameter sensitivity corresponds to the highest possible positive supply voltage (e.g., 1.0V). Then, using an interpolation process, different numbers (x) of standard deviations (σ) of the performance parameter sensitivity (e.g., delay sensitivity ($D_{sensitivity}$) in picoseconds/σ) can be associated with various different positive supply voltages between the lowest and highest possible positive supply voltages, thereby indicating how changes in the positive supply voltage (i.e., increases or decreases in the positive supply voltage) impact the number (x) of standard deviations of the delay sensitivity ($D_{sensitivity}$), as defined in equation (1). Various different interpolation techniques that are well known in the art can be used to compute these different numbers (x) of standard deviations (σ) of performance parameter sensitivity (e.g., based on library information for the integrated circuit chip) and it should be understood that the relationship between the different numbers (x) of standard deviations (σ) of the performance parameter sensitivity and the different positive supply voltages may not be linear (as illustrated in the table of FIG. 6).

The design, timing models and library information can then be used to define all of the parameters required for subsequently performing a timing analysis of the integrated circuit chip including, but not limited to voltage, process and product reliability parameters (406). The required parameters for performing timing analyses are well known in the art and, thus, the details of such parameters have been omitted from this specification in order to allow the reader to focus on the salient aspects of the disclosed method.

Once the timing analysis parameters are defined, a timing analysis of the integrated circuit chip 130 can be performed (408). This timing analysis can comprise any suitable form of timing analysis (e.g., a statistical static timing analysis (SSTA), a multi-corner/multi-mode timing analysis, etc.) and can initially be performed, assuming a first age of the integrated circuit chip 130 and using a first positive supply voltage in order to predict the performance of the integrated circuit chip 130. Specifically, the timing analysis can be performed assuming an initial age (referred to herein as a first age) and using an initial positive supply voltage (referred to herein as a first positive supply voltage) in order to predict the arrival times of clock and data signals within the integrated circuit chip and, thereby to determine at least a first value for a performance parameter (e.g., a first value for delay) of the integrated circuit chip. It should be noted that the initial age (i.e., the first age) can be the initial number of POHs at the beginning of life (BOL) of the integrated circuit chip 130 (e.g., zero POHs) and, thus, the corresponding change in the performance parameter sensitivity (i.e., $x\sigma D_{sensitivity}$), as defined by equation (1), will be equal to 0 and the nominal delay value ($D_{nominal}$) will, therefore, be equal to that first value for delay. It should further be noted that the initial positive supply voltage can be any positive supply voltage within the earlier defined range and, for example, can be a positive supply voltage as set by the technology or by the voltage regulator used. In a SSTA, the first value for delay can be a first canonical model of delay. In any case, the first age and first positive supply voltage can be the initial values added to the columns in the initial row of the age/voltage table (e.g., zero POHs and 0.79 V in the initial row of the age/voltage table of FIG. 2).

Then, a second age can be selected and, again using the first positive supply voltage, a second value for the performance parameter (e.g., a second value for delay) at this second age can be determined based on the first value for the performance parameter (e.g., the first value for delay) and using the age-to-performance parameter sensitivity table (410). Specifically, the second age can be some age between the first age and a target age for the expected end of life (EOL) of the integrated circuit chip. Thus, for example, if the first age is zero POHs and the target age is 2000 POHs, the second age can be 500 POHs. Once the second age is selected, it can be used to acquire, from the age-to-performance parameter sensitivity table created at process 404 (e.g., see FIG. 5), the number of standard deviations of performance parameter sensitivity associated with the second age (e.g., the number of standard deviations of delay sensitivity ($x\sigma D_{sensitivity}$) associated with the second age). Then, using the first value for the performance parameter (e.g., the first value for delay) as a nominal value for the performance parameter (e.g., as the nominal delay value ($D_{nominal}$)) and using the number of standard deviations of performance parameter sensitivity (e.g., the number of standard deviations of delay sensitivity ($x\sigma D_{sensitivity}$)), as acquired from the age-to-performance parameter sensitivity table), the second value for the performance parameter (e.g., the second value for delay) can be determined, for example, by solving for the actual performance parameter value (e.g., the actual delay value ($D_{actual}$) in equation (1)).

Next, the method can comprise determining whether, given the second value for the performance parameter (e.g., the second value for delay) determined at process 410, the integrated circuit chip 130 fails to meet a timing target (e.g., a slack target) for the integrated circuit chip 130 (412). If not, then the method can comprise determining an age-optimized positive supply voltage and, more particularly, determining what second positive supply voltage, which is greater than the first positive supply voltage, should be used to adjust the performance parameter (e.g., the delay) such that the integrated circuit chip meets that timing target (414). To determine the second positive supply voltage, the number of standard deviations of performance parameter sensitivity that are associated with the second age (e.g., the number (x) of standard deviations of delay sensitivity ($x\sigma D_{sensitivity}$) that are associated with the second age) can be acquired, as mentioned above, from the age-to-performance parameter sensitivity table created at process 404. Using the number (x) of standard deviations of the performance parameter sensitivity associated with the second age and also using a given timing target and, particularly, a given slack target (e.g., a 0 slack target), the following equations can be solved to determine another number (x) of standard deviations of the performance parameter sensitivity associated with the unknown second positive supply voltage (e.g., another number (x) of standard deviations of delay sensitivity ($x\sigma D_{sensitivity}$) associated with the unknown second positive supply voltage):

$$\text{Slack}=a_0+a_1\Delta Vdd+a_2\Delta\text{ProductReliability, and, thus,} \quad (3)$$

$$a_1\Delta Vdd=\text{Slack}-a_0-a_2\Delta\text{ProductReliability,} \quad (4)$$

where $a_0$ is the nominal delay value ($D_{nominal}$) (also referred to as the zero-σ delay value for the delay distribution), $a_2\Delta$ProductReliability is the number (x) of standard deviations of the performance parameter sensitivity associated with the second age (e.g., the number (x) of standard deviations of delay sensitivity ($x\sigma D_{sensitivity}$) associated with the second age) as acquired from the age-to-performance parameter sensitivity table, and $a_1\Delta Vdd$ is another number (x) of standard deviations of the performance parameter sensitivity associated with the unknown second positive supply voltage (e.g., another number (x) of standard deviations of delay sensitivity ($x\sigma D_{sensitivity}$) associated with the unknown second positive supply voltage). Once $a_1\Delta Vdd$ is determined using equation (4), its value can be used to acquire the value of the second positive supply voltage (i.e., the value of an age-optimized positive supply voltage) from the voltage-to-performance parameter sensitivity table (e.g., the voltage-to-delay sensitivity table, as shown in FIG. 6). The second age and second positive supply voltage, which was acquired from the voltage-to-performance parameter sensitivity table, can be the next values added into the next row of the age/voltage table (e.g., 500 POHs and 0.80V in the second row of the age/voltage table of FIG. 2).

These same processes can, optionally, be iteratively repeated to acquire additional age-optimized positive supply voltages for additional ages (e.g., a third age, a fourth age, etc.) to add additional rows to the age/voltage table until such time as a target age for the integrated circuit chip within the product is reached. Specifically, if a timing target is achieved (e.g., once the second positive supply voltage for the second age is determined), a determination can be made as to whether or not age-optimized positive supply voltages have been determined to compensate for changes in the performance parameter sensitivity (e.g., the delay sensitivity) for all ages up to the target age of the integrated circuit chip 130 (416). If not, a third age (e.g., which is some age above the second age) can be selected (418) and the processes 410, 412, 414 and 416 can be repeated. That is, a third value for the performance parameter can be determined at the third age. This third value can be determined using the second positive supply voltage and based on the first value of the performance parameter (i.e., the nominal value of the performance parameter) and the age-to-performance parameter sensitivity table (410). Then, a determination can be made as to whether, given the third value, the integrated circuit chip fails to meet the timing target for the integrated circuit chip (416). When the integrated circuit chip does fail to meet the timing target, a third positive supply voltage, which can be used to adjust the performance parameter such that the integrated circuit chip meets the timing target, can be determined (414). The third age and third positive supply voltage can be the next values added into the next row of the age/voltage table (e.g., 1000 POHs and 0.82V in the third row of the age/voltage table of FIG. 2). At this point, if the timing target is achieved (e.g., once the third positive supply voltage for the third age is determined), a determination can be made as to whether or not age-optimized positive supply voltages have been determined to compensate for changes in the performance parameter sensitivity (e.g., delay sensitivity) for all ages up to the target age of the integrated circuit chip 130 (416). If not, a fourth age (e.g., which is above the third age) can be selected (418) and the processes 410, 412, 414 and 416 can be repeated. Once age-optimized supply voltages have been determined to compensate for changes in the performance parameter sensitivity (e.g., delay sensitivity) for all ages up to the target age, the age/voltage table can be completed.

Optionally, the above described processes 406-418 can be performed following selective voltage binning. That is, before the parameters for the timing analysis are defined and before the timing analysis is performed, the method can comprise performing selective voltage binning (405). During this selective voltage binning, multiple integrated circuit chips having the same design can be sorted into two or more different groups based on different operating speeds. These different operating speeds can, for example, be the result of process variations. Then, different first positive supply voltages can be assigned to the different groups based on the different operating speeds. For example, lower first supply voltages can be assigned to faster integrated circuit chips and higher first supply voltages can be assigned to slower integrated circuit chips. In this case, a unique age/voltage table can be generated, as described above in processes 408-418, for the integrated circuit chips in each of the different groups using the different first positive supply voltages (i.e., the different initial positive supply voltage) assigned to the different groups, respectively, to perform the timing analysis.

As mentioned above, the selected ages and the corresponding age-optimized positive supply voltages acquired using processes 414-416 can be used to generate a unique age/voltage table for all integrated circuit chips having a same design (or for all integrated circuit chips having a same design and sorted into a same selective voltage bin). This unique age/voltage table 132 can then be stored in a memory 131 on-board an instance of the integrated circuit chip 130 for use, as described in detail above in the system 100 of FIG. 1 and the method of FIG. 3, in regulating the positive supply voltage applied to the power rail 136 of the integrated circuit chip 130 (420).

Also disclosed herein is a computer program product. This computer program product can comprise a computer readable storage medium having program instructions embodied therewith. The program instructions can be executable by a computer to cause the computer to perform the above-described method for generating the age/voltage table for generating the age/voltage table, which is used in the above-described system and method. More particularly, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
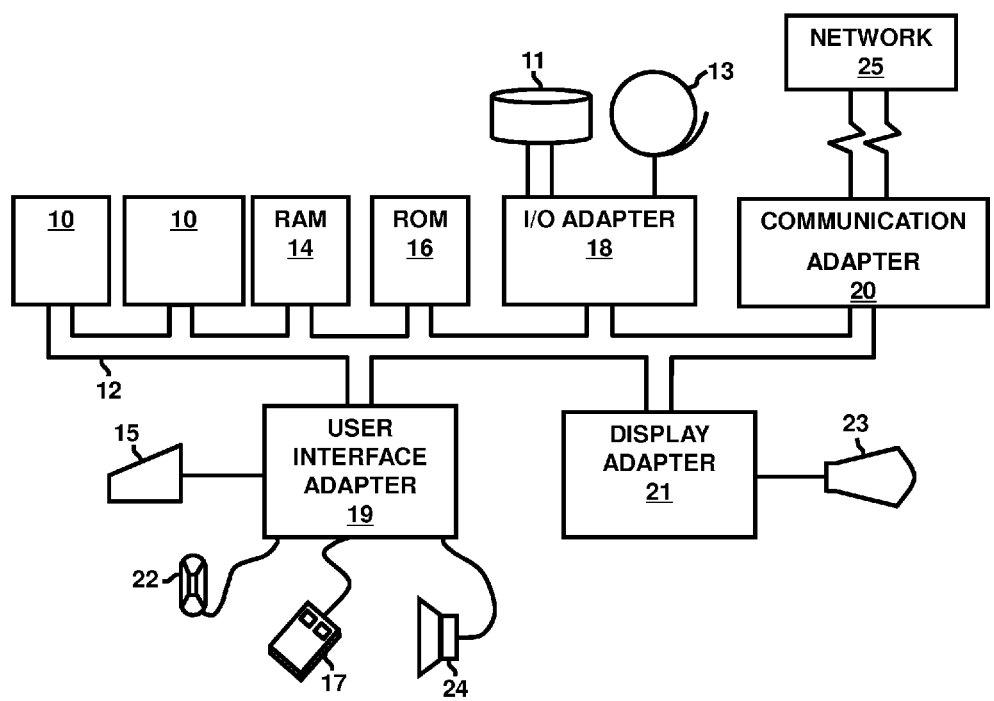

FIG. 7 depicts a representative hardware environment (i.e., a computer system) for implementing the method for generating the age/voltage table as disclosed herein. Specifically, this schematic drawing illustrates a hardware configuration of an information handling/computer system. This computer system comprises at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above is a system for regulating the power supplied to an integrated circuit chip that is incorporated into a product and, particularly, for periodically increasing the supply voltage applied to a power rail of the integrated circuit chip in order to compensate for age-dependent changes in a performance parameter (e.g., delay) and, particularly, in a performance parameter sensitivity (e.g., delay sensitivity), which is a measure of product reliability. Specifically, the system can comprise an integrated circuit chip and an adjustable voltage regulator, which are incorporated into a product (e.g., on a printed circuit board). The integrated circuit chip can comprise a memory, an age monitor, a voltage selector and a power rail for a positive supply voltage. The memory can store an age/voltage table. The age monitor can automatically measure the age of the chip. Based on the measured age and using the age/voltage table, the voltage selector can select a specific, age-optimized, positive supply voltage and can output the selection, as a voltage selection signal, to the adjustable voltage regulator. The adjustable voltage regulator can subsequently apply (e.g., automatically or on-demand) that specific, age-optimized, positive supply voltage to the power rail, ensuring that product-level power and performance requirements are met until the expected end of life (EOL) of the integrated circuit chip without requiring the use of a voltage margin. Also disclosed above are an associated method for regulating the power supplied to an integrated circuit chip and a method for generating the age/voltage table used to regulate the power supplied to an integrated circuit chip.

What is claimed is:

1. A system comprising:
   an adjustable voltage regulator; and,
   an integrated circuit chip,
   said adjustable voltage regulator and said integrated circuit chip each being incorporated into a product,
   said integrated circuit chip comprising:
      a power rail;
      a power supply pin electrically connecting said power rail and said adjustable voltage regulator;
      a memory storing an age/voltage table that associates different ages of said integrated circuit chip with different supply voltages for said power rail;
      an age monitor automatically measuring an age of said integrated circuit chip;
      a voltage selector in communication with said age monitor, said memory and said adjustable voltage regulator, said voltage selector accessing said age/voltage table, using said age/voltage table to automatically make a selection of a specific supply voltage for said power rail based on said age and outputting said selection, as a voltage selection signal, to said adjustable voltage regulator, and
   said adjustable voltage regulator applying said specific supply voltage to said power rail in response to said voltage selection signal.

2. The system of claim 1, said age/voltage table providing for higher supply voltages as said integrated circuit chip ages.

3. The system of claim 1, said age being measured as power-on-hours of said integrated circuit chip.

4. The system of claim 1, said age being measured as a change in a measurable performance parameter.

5. The system of claim 1, said selection being based on said age so that said adjustable voltage regulator applies an age-optimized supply voltage to said power rail to ensure that product-level power and performance requirements are met until an expected end of life of said integrated circuit chip without requiring use of a voltage margin.

6. The system of claim 1,
   said integrated circuit chip comprising a second power rail,
   said memory storing a second age/voltage table for said second power rail,
   said voltage selector using said second age/voltage table to automatically make a second selection of a second specific supply voltage for said second power rail based on said age and outputting said second selection to said adjustable voltage regulator, and
   said adjustable voltage regulator applying said second specific supply voltage to said second power rail.

7. A method for regulating power supplied to an integrated circuit chip incorporated into a product, said method comprising:
   automatically measuring an age of said integrated circuit chip, said measuring being performed by an age monitor on said integrated circuit chip;
   accessing an age/voltage table that is stored in memory on said integrated circuit chip and that associates different ages of said integrated circuit chip with different supply voltages for a power rail supplying power to said integrated circuit chip;
   using said age/voltage table to automatically make a selection of a specific supply voltage for said power rail of said integrated circuit chip based on said age; and,
   outputting said selection, as a voltage selection signal, to an adjustable voltage regulator that is incorporated into said product so as to cause said adjustable voltage regulator to automatically apply said specific supply voltage to said power rail,
   said accessing of said age/voltage table, said using of said age/voltage table to automatically make said selection and said outputting of said selection being performed by a voltage selector on said integrated circuit chip.

8. The method of claim 7, said age/voltage table providing for higher supply voltages as said integrated circuit chip ages.

9. The method of claim 7, said age being measured as power-on-hours of said integrated circuit chip.

10. The method of claim 7, said age being measured as a change in a measurable performance parameter.

11. The method of claim 7, said selection being based on said age so that said adjustable voltage regulator applies an age-optimized supply voltage to said power rail to ensure that product-level power and performance requirements are met until an expected end of life of said integrated circuit chip without requiring use of a voltage margin.

12. The method of claim 7, further comprising
   accessing a second age/voltage table for a second power rail on said integrated circuit chip, said second age/voltage table being stored in said memory;
   using said second age/voltage table to automatically make a second selection of a second specific supply voltage for said second power rail based on said age;
   outputting said second selection, as a second voltage selection signal, to said adjustable voltage regulator so as to cause said adjustable voltage regulator to automatically apply said second specific supply voltage to said second power rail,
   said using of said second age/voltage table to automatically make said second selection and said outputting of said second selection being performed by said voltage selector.

13. A method for generating an age/voltage table for an integrated circuit chip, said method comprising:
   performing a timing analysis of said integrated circuit chip, said timing analysis being performed assuming a first age and using a first supply voltage to determine a first value for a performance parameter;
   selecting a second age;
   determining a second value for said performance parameter at said second age using said first supply voltage, said determining of said second value being performed based on said first value and an age-to-performance parameter sensitivity relationship;

determining whether, given said second value, said integrated circuit chip fails to meet a timing target for said integrated circuit chip; and, when said integrated circuit chip fails to meet said timing target, determining a second supply voltage to adjust said performance parameter such that said integrated circuit chip meets said timing target.

14. The method of claim 13, said timing analysis comprising a statistical static timing analysis.

15. The method of claim 13, said performance parameter comprising delay, said performance parameter sensitivity comprising delay sensitivity and said timing target comprising a slack target.

16. The method of claim 13, said first age comprising a first number of power-on-hours and second age comprising a second number of power-on-hours greater than said first number.

17. The method of claim 14, said age-to-performance parameter sensitivity relationship being defined in an age-to-performance parameter sensitivity table that indicates different numbers of standard deviations of said performance parameter sensitivity for different ages.

18. The method of claim 17, said determining of said second supply voltage comprising:
   acquiring a number of standard deviations of said performance parameter sensitivity associated with said second age from said age-to-performance parameter sensitivity table using said second age;
   given said timing target and said number of standard deviations of said performance parameter sensitivity associated with said second age, determining an additional number of standard deviations of said performance parameter sensitivity associated with said second supply voltage; and,
   acquiring said second supply voltage from a voltage-to-performance parameter sensitivity table using said additional number of standard deviations of said performance parameter associated with said second supply voltage.

19. The method of claim 13, further comprising,
   selecting a third age;
   determining a third value for said performance parameter at said third age using said second supply voltage, said determining of said third value being performed based on said first value and said age-to-performance parameter sensitivity relationship;
   determining whether, given said third value, said integrated circuit chip fails to meet said timing target for said integrated circuit chip; and,
   when said integrated circuit chip fails to meet said timing target, determining a third supply voltage to adjust said performance parameter such that said integrated circuit chip meets said timing target.

20. The method of claim 13, further comprising, before said performing of said timing analysis, performing selective voltage binning to sort multiple integrated circuit chips having a same design into different groups based on different operating speeds; and assigning different first supply voltages to said different groups based on said different operating speeds.

* * * * *